(12) United States Patent
Guo et al.

(10) Patent No.: US 10,070,551 B2
(45) Date of Patent: Sep. 4, 2018

(54) HOUSING MODULE AND ELECTRONIC DEVICE WITH CIRCUIT BOARD QUICK-ASSEMBLING FUNCTION

(71) Applicant: Wistron Corporation, New Taipei (TW)

(72) Inventors: Zhi Ming Guo, New Taipei (TW); Chen-Yu Li, New Taipei (TW); Jun Hao Wang, New Taipei (TW); Chong-Xing Zhu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/802,469

(22) Filed: Nov. 3, 2017

(65) Prior Publication Data

US 2018/0063982 A1 Mar. 1, 2018

Related U.S. Application Data

(62) Division of application No. 15/299,472, filed on Oct. 21, 2016, now Pat. No. 9,961,794.

(30) Foreign Application Priority Data

May 20, 2016 (CN) .......................... 2016 1 0348301

(51) Int. Cl.
*H05K 7/14* (2006.01)
*H05K 5/03* (2006.01)
*G11B 33/14* (2006.01)

(52) U.S. Cl.
CPC ........... *H05K 7/142* (2013.01); *G11B 33/142* (2013.01); *H05K 5/03* (2013.01); *H05K 7/1418* (2013.01); *H05K 7/1489* (2013.01)

(58) Field of Classification Search
CPC .... H05K 7/142; H05K 7/1411; H05K 7/1418; H05K 7/1422; H05K 7/1461; H05K 7/1489; H05K 5/03; H05K 5/0226; G06F 1/181; G06F 1/183; G06F 1/184
USPC ....................... 361/679.01, 679.02, 725, 727
See application file for complete search history.

(56) References Cited

U.S. PATENT DOCUMENTS 5,214,572 A * 5/1993 Cosimano ............... G06F 1/184
 211/41.17
8,305,756 B2 * 11/2012 Regimbal ............ H05K 7/2019
 361/695
8,540,109 B1 * 9/2013 McPeek ................. A45C 13/02
 190/36

(Continued)

*Primary Examiner* — Mukund G Patel
(74) *Attorney, Agent, or Firm* — Winston Hsu

(57) ABSTRACT

A housing module having a circuit board quick-assembling function is applied to an electronic device with a circuit board having a specific height. The housing module includes a housing, an spacer and two pivoting components. The housing includes a substrate and several lateral boards. The spacer includes a main body, two pivoting portions and a locking portion. The pivoting portions are disposed on corresponding sides of the main body, the locking portion stretches from a lower side of the main body and is fixed on the circuit board via an external fixing component. The pivoting portions pass through the lateral boards and are connected to the pivoting portions. While the circuit board slides relative to the substrate to push the spacer, the main body is rotated inside the housing via the pivoting portions to lift the lower side.

14 Claims, 11 Drawing Sheets

(56) References Cited

U.S. PATENT DOCUMENTS 9,723,756 B1 * 8/2017 Masters ............. H05K 7/20709

* cited by examiner

HOUSING MODULE AND ELECTRONIC DEVICE WITH CIRCUIT BOARD QUICK-ASSEMBLING FUNCTION

CROSS REFERENCE TO RELATED APPLICATIONS

This application is a divisional application of and claims the benefit of U.S. application Ser. No. 15/299,472 filed 2016 Oct. 21.

BACKGROUND OF THE INVENTION

1. Field of the Invention

The present disclosure relates to a housing module and a related electronic device, and more particularly, to a housing module and a related electronic device having the circuit board quick-assembling function.

2. Description of the Prior Art

Please refer to FIG. 1. FIG. 1 is a diagram of a server 70 in the prior art. The server 70 has a circuit board 74 disposed inside a housing 72. A plurality of partitions 76 is fixed on the housing 72 by fixing components 78 (such as the rivet or the screw) to form several chambers. The detachable module is set into the foresaid chamber and connected with a connector 80 on the circuit board 74. As shown in FIG. 1, a distance is formed between a bottom of the partition 76 and the circuit board 74. As height of the connector 80 is smaller than the said distance, the circuit board 74 can be freely assembled with and disassembled from the housing 72; as the height of the connector 80 or height of components on the circuit board 74 is greater than the said distance, the fixing components 78 have to be unlocked to detach the partition 76 from the housing 72, so as to provide sufficient space in the housing 72 for removal of the circuit board 74. Thus, the conventional server 70 has drawbacks of complicated assembly and disassembly process, and extra cost of the detachable partition 76 specially packed.

SUMMARY OF THE INVENTION

The present disclosure provides a housing module and a related electronic device having the circuit board quick-assembling function for solving above drawbacks.

According to the claimed disclosure, a housing module has a circuit board quick-assembling function and is capable of being applied to a circuit board with a specific height. The housing module includes a housing, at least one spacer and two pivoting components. The housing includes a substrate and a plurality of lateral boards, the plurality of lateral boards is respectively connected to edges of the substrate to form an accommodating space. The spacer is a kind of board structure, which includes a main body, two pivoting portions and a locking portion. The two pivoting portions are respectively disposed on corresponding lateral sides of the main body. The locking portion stretches from a bottom side of the main body. The two pivoting components respectively pass through the plurality of lateral boards and are connected to the corresponding pivoting portions. The main body is rotated within the accommodating space via the two pivoting portions while the circuit board slides relative to the substrate to push the spacer, so as to lift the bottom side away from the substrate.

According to the claimed disclosure, the housing further includes two protruding portions respectively disposed on position of the plurality of lateral boards corresponding to the two pivoting portions, the two pivoting components respectively pass through the corresponding pivoting portions and the corresponding protruding portions to space the corresponding lateral sides of the main body from the plurality of lateral boards.

According to the claimed disclosure, the housing further includes a constraining portion disposed on one of the plurality of lateral boards and adjacent to one of the two protruding portions.

According to the claimed disclosure, the housing further includes a cover detachably disposed on position of the plurality of lateral boards opposite to the substrate and adapted to cover the accommodating space, and a detachable module is assembled inside the accommodating space through the cover.

According to the claimed disclosure, the spacer further includes a track structure disposed on the main body.

According to the claimed disclosure, the housing module further includes a plurality of spacers and a linking component, and several sections of the linking component are respectively connected to main bodies of the plurality of spacers.

According to the claimed disclosure, the linking component includes a buckling portion adapted to buckle a connective portion disposed on one of the plurality of lateral boards while the plurality of spacers is rotated relative to the housing to a specific angle.

According to the claimed disclosure, the buckling portion is a dual-bending structure, a first section of the dual-bending structure is connected to a body of the linking component in a resiliently deformable manner, and a second section of the dual-bending structure slidably contacts against one of the plurality of lateral boards, so as to buckle the buckling portion with the connective portion while the buckling portion and the connective portion are aligned.

According to the claimed disclosure, the connective portion is an edge of the lateral board, or an engaging slot formed on the lateral board.

According to the claimed disclosure, the specific angle is ranged between 70 degrees and 90 degrees.

According to the claimed disclosure, the housing module further includes a fixing component passing through the locking portion and the circuit board to constrain rotation of the spacer.

According to the claimed disclosure, an electronic device having a circuit board quick-assembling function includes a housing module and a circuit board. The housing module includes a housing, at least one spacer and two pivoting components. The housing includes a substrate and a plurality of lateral boards, the plurality of lateral boards is respectively connected to edges of the substrate to form an accommodating space. The spacer includes a main body, two pivoting portions and a locking portion. The two pivoting portions are respectively disposed on corresponding lateral sides of the main body. The locking portion stretches from a bottom side of the main body. The two pivoting components respectively pass through the plurality of lateral boards and are connected to the corresponding pivoting portions. The circuit board is slidably disposed on the substrate, and the spacer is pushed by the circuit board sliding relative to the substrate, so as to rotate the main body within the accommodating space via the two pivoting portions and to lift the bottom side away from the substrate.

According to the claimed disclosure, the circuit board includes a main board and an external board, the external board is disposed on the main board, and a distance between the substrate and the bottom side of the main body is greater than a thickness of the main board and smaller than a structural height of the external board.

According to the claimed disclosure, the electronic device further includes a detachable module disposed inside the accommodating space of the housing, and is adapted to contact against the spacer and connect with the circuit board.

According to the claimed disclosure, the housing module and the related electronic device of the present application have the circuit board quick-assembling function, the circuit board with the erected external board can be freely assembled with and disassembled from the housing without detachment of the spacer, so as to increase assembly period and decrease packing and transportation cost for preferred product competition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
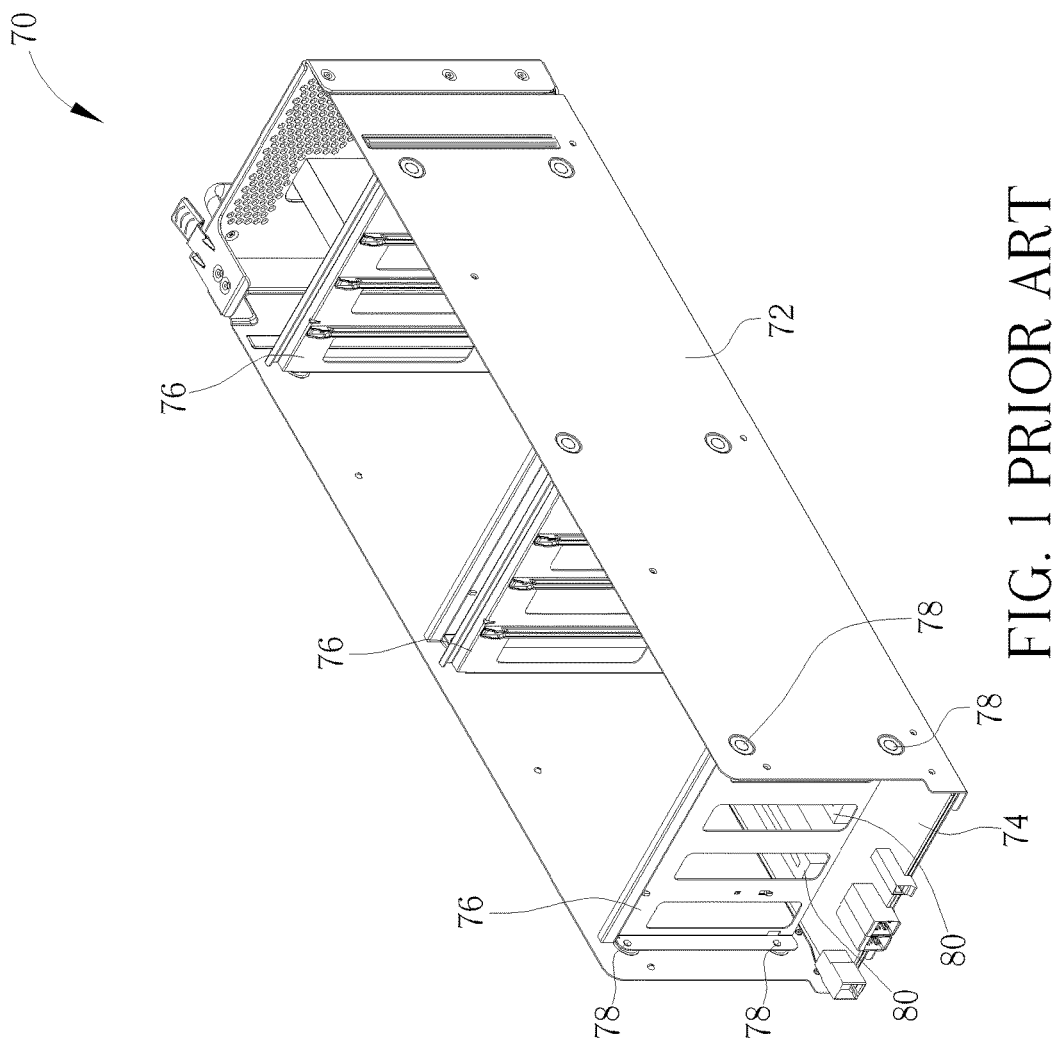
FIG. 1 is a diagram of a server in the prior art.
Figure 2:
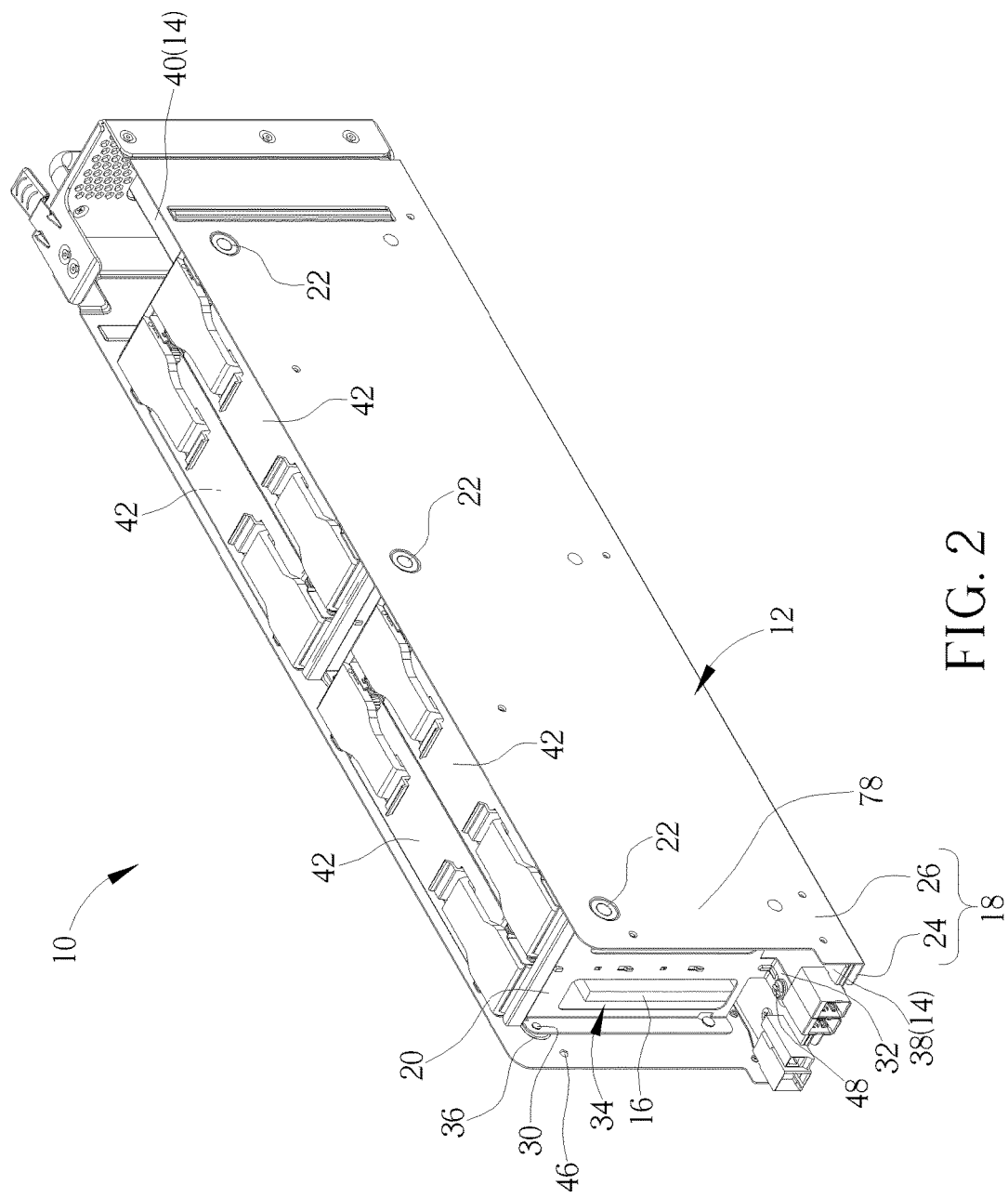
FIG. 2 is a diagram of an electronic device according to an embodiment of the present application.
Figure 3:
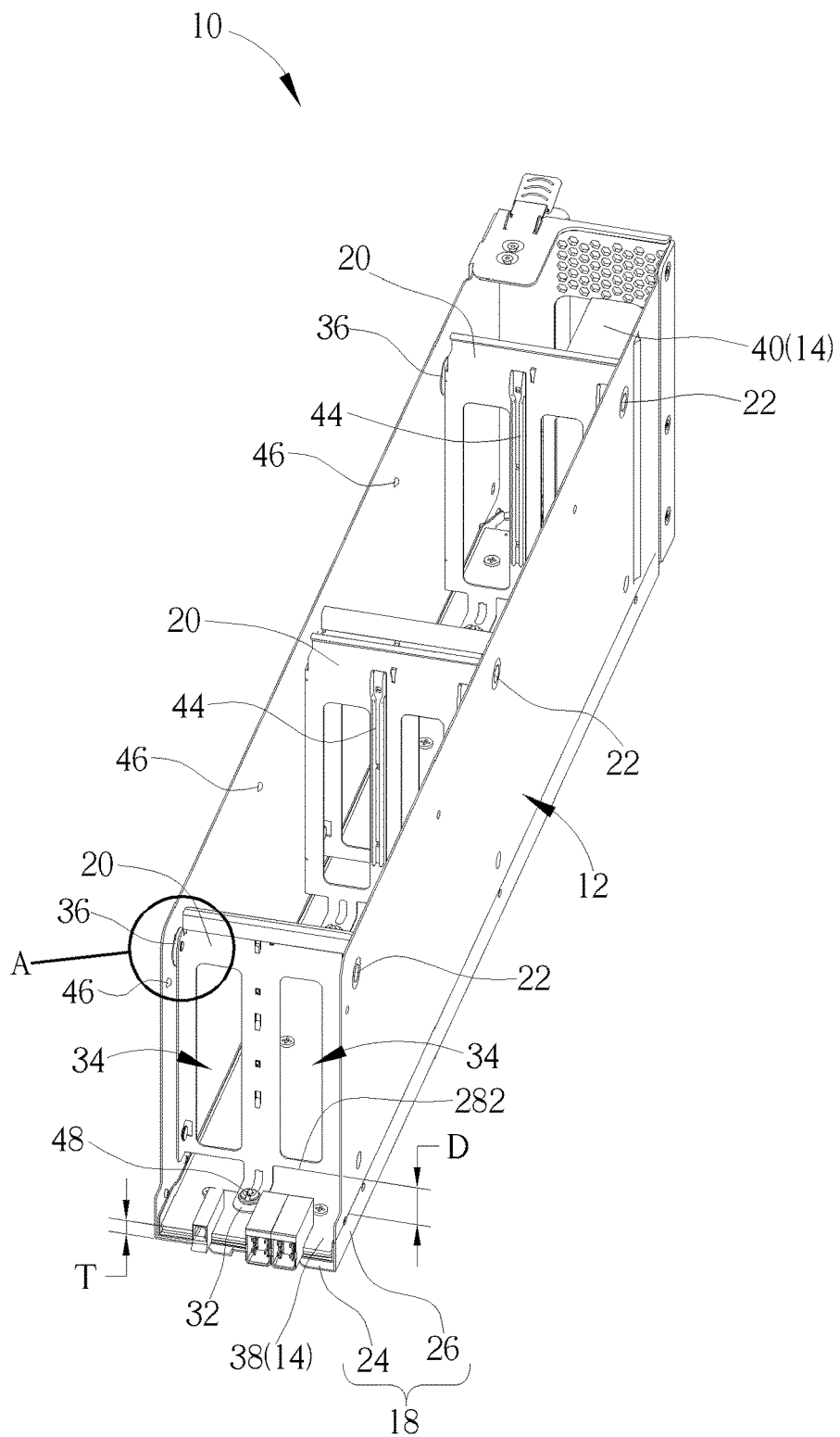
FIG. 3 is a diagram of the electronic device without a cover and a detachable module according to the embodiment of the present application.
Figure 4:
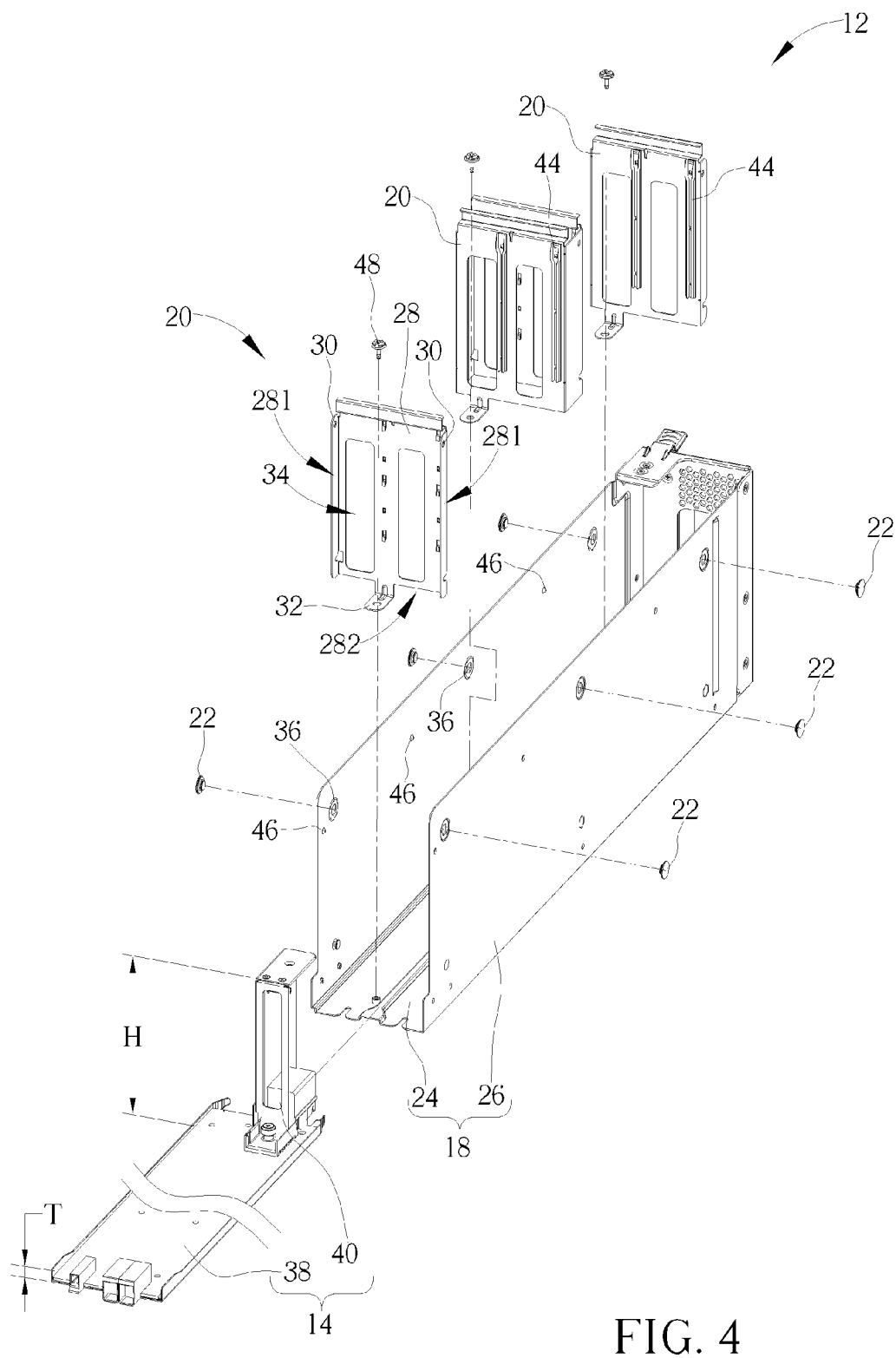
FIG. 4 is an exploded diagram of a housing module and a circuit board according to the embodiment of the present application.

Please refer to FIG. 2 to FIG. 4. FIG. 2 is a diagram of an electronic device 10 according to an embodiment of the present application. FIG. 3 is a diagram of the electronic device 10 without a cover 42 and a detachable module 16 according to the embodiment of the present application. FIG. 4 is an exploded diagram of a housing module 12 and a circuit board 14 according to the embodiment of the present application. The electronic device 10 includes the housing module 12, the circuit board 14 and the detachable module 16. The electronic device 10 preferably can be a server system, and the detachable module 16 preferably can be an electronic component of the server system, such as the detachable hard disk driver. The circuit board 14 is disposed inside the housing module 12. The detachable module 16 is assembled inside the housing module 12 to connect with the circuit board 14. Generally, the electronic device 10 may contain several detachable modules 16, and the housing module 12 is divided into several chambers by at least one spacer 20 for accommodating the detachable modules 16. In the embodiment, the circuit board 14 can be removed from the housing module 12 without detaching the spacer 20, the present application provides a circuit board quick-assembling function to avoid complicated assembly and disassembly process.

The housing module 12 can include a housing 18, the spacer 20 and several pivoting components 22. The housing 18 may have a substrate 24 and a plurality of lateral boards 26. The plurality of lateral boards 26 is respectively connected to edges of the substrate 24 to form an accommodating space whereinside the circuit board 14 and the detachable module 16 are disposed. The spacer 20 includes a main body 28, several pivoting portions 30 and a locking portion 32. The main body 28 is a slice structure. At least one opening 34 can be formed on the slice structure to dissipate heat generated by the detachable module 16. The pivoting portions 30 are respectively disposed on corresponding lateral sides 281 of the main body 28, the locking portion 32 stretches from a bottom side 282 of the main body 28. A protruding portion 36 is disposed on the lateral board 26, and position of the protruding portion 36 corresponds to position of the pivoting portion 30 on the spacer 20. The pivoting component 22 passes through the corresponding pivoting portion 30 and the corresponding protruding portion 36 to rotatably connect the spacer 20 with the housing 18, and the lateral side 281 of the main body 28 can be spaced from the lateral board 26 to reduce friction.

The circuit board 14 is slidably disposed on the substrate 24. The circuit board 14 includes a main board 38 and an external board 40, and the external board 40 is usually erected on the main board 38. As shown in FIG. 3 and FIG. 4, a thickness T of the main board 38 may be smaller than a distance D between the bottom side 282 of the main body 28 and the substrate 24, and a structural height H of the external board 40 may be greater than the distance D. The housing 18 further can include a cover 42 detachably disposed on position of the lateral board 26 opposite to the substrate 24 and adapted to cover the accommodating space. The spacer 20 may dispose a track structure 44 on the main body 28. While replacing the detachable module 16, the cover 42 is unfolded to expose an entrance of the accommodating space, the detachable module 16 slides into the accommodating space via the track structure 44 to connect with the circuit board 14.

Figure 5:
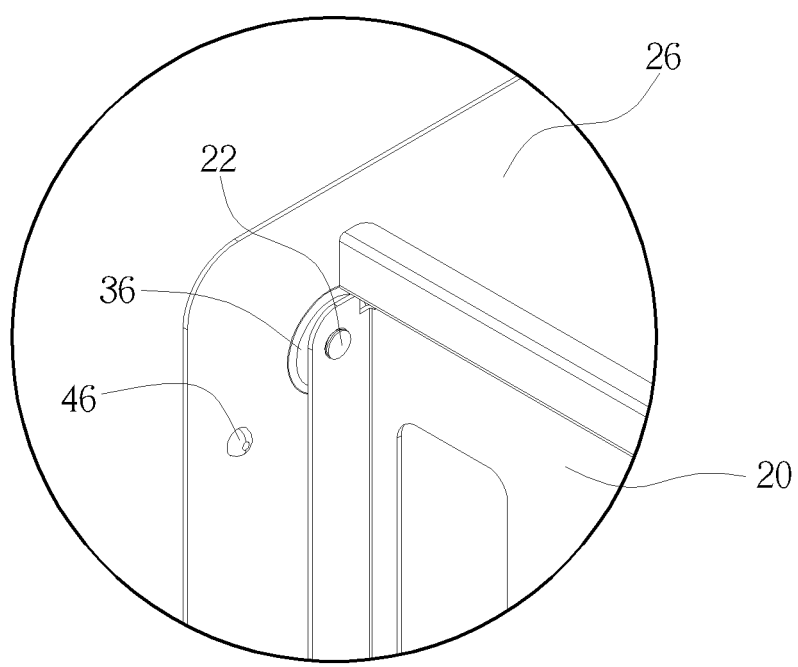
FIG. 5 is an enlarged diagram of a region A shown in FIG. 3.
Figure 6:
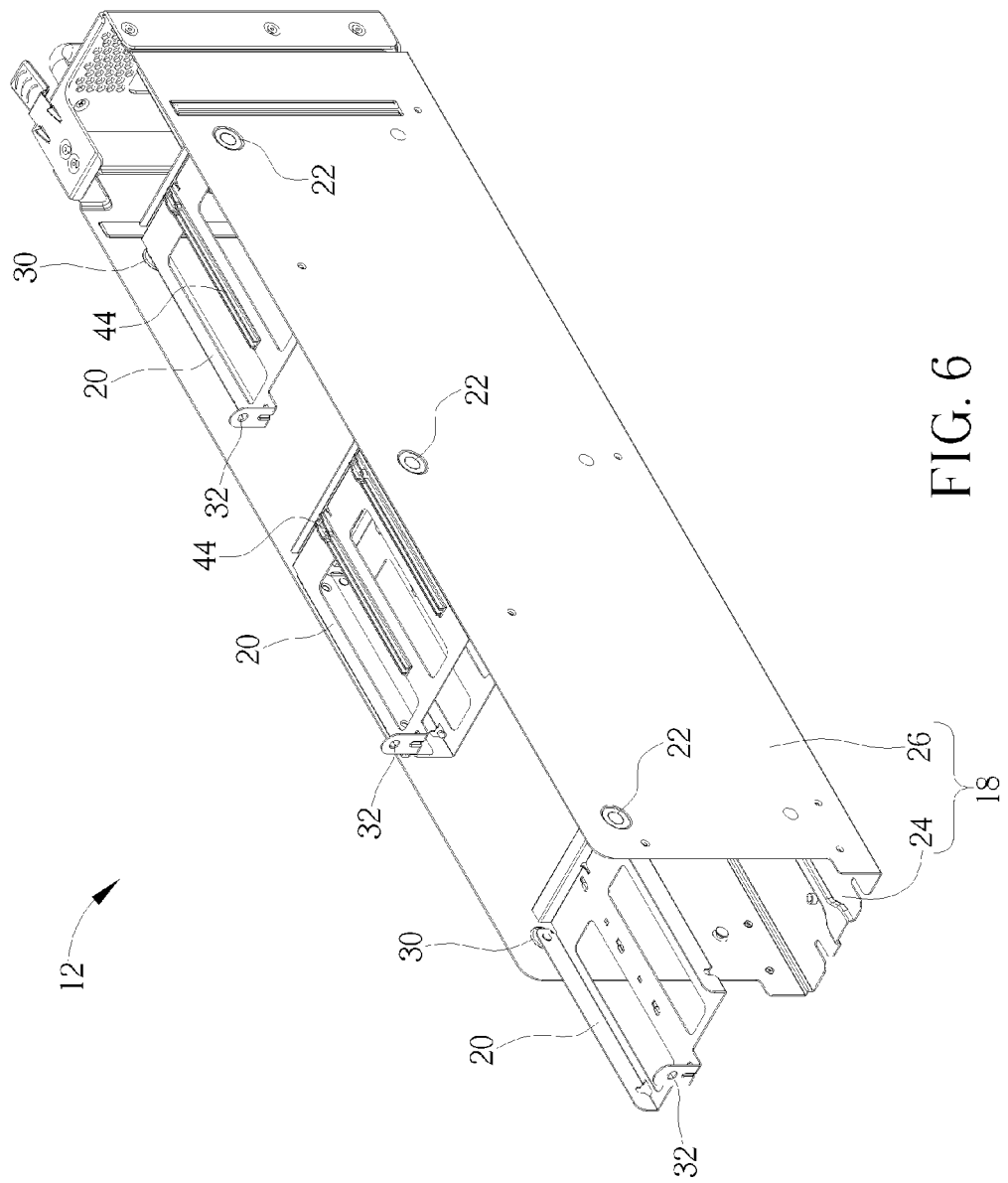
FIG. 6 is a diagram of the housing module and the circuit board according to the embodiment of the present application.

Please refer to FIG. 3, FIG. 5 and FIG. 6. FIG. 5 is an enlarged diagram of a region A shown in FIG. 3. FIG. 6 is a diagram of the housing module 12 and the circuit board 14 according to the embodiment of the present application. Because the spacer 20 stays on a moving path of the external board 40 of the circuit board 14, the spacer 20 can be manually rotated or automatically rotated by a motor before assembling the circuit board 14 into the housing module 12. The main body 28 of the spacer 20 is rotated relative to the lateral board 26 via the pivoting portion 30 to lift the bottom side 282 of the main body 28 away from the substrate 24; in the meantime, the spacer 20 contacts against the protruding portion 36 to prevent frictional resistance between the spacer 20 and the lateral board 26 for smooth operation. The lateral board 26 may have one or more constraining portions 46 disposed adjacent by the protruding portion 36. In addition, level of the constraining portion 46 can be equal to or higher than level of the protruding portion 36, which means an interval between the constraining portion 46 and the substrate 24 can be equal to an interval between the protruding portion 36 and the substrate 24, and the interval between the constraining portion 46 and the substrate 24 is greater than a maximal structural height of the circuit board 14 (which represents a sum of a thickness T of the main board 38 and a structural height H of the external board 40).

Therefore, the spacer 20 is upwardly rotated to cross the lateral side 281 of the main body 28 over the corresponding constraining portion 46, a bottom of the spacer 20 is supported by the constraining portion 46 to avoid the spacer 20 from falling by gravity, the accommodating space inside the housing 18 is allowed motion of the circuit board 14 sliding into the housing module 12 without structural interference of the spacer 20. As shown in FIG. 6, the upward rotated angle of the spacer 20 is preferably equal to, but not limited to, ninety degrees. The upward rotated angle of the spacer 20 can be varied according to dimensions of the external board 40 of the circuit board 14, which means position of the constraining portion 46 on the lateral board 26 is optionally set in accordance with the dimensions of the external board 40. As the external board 40 is large, the upward rotated angle of the spacer 20 is increased accordingly to move spacer 20 across the external board 40.

Figure 7:
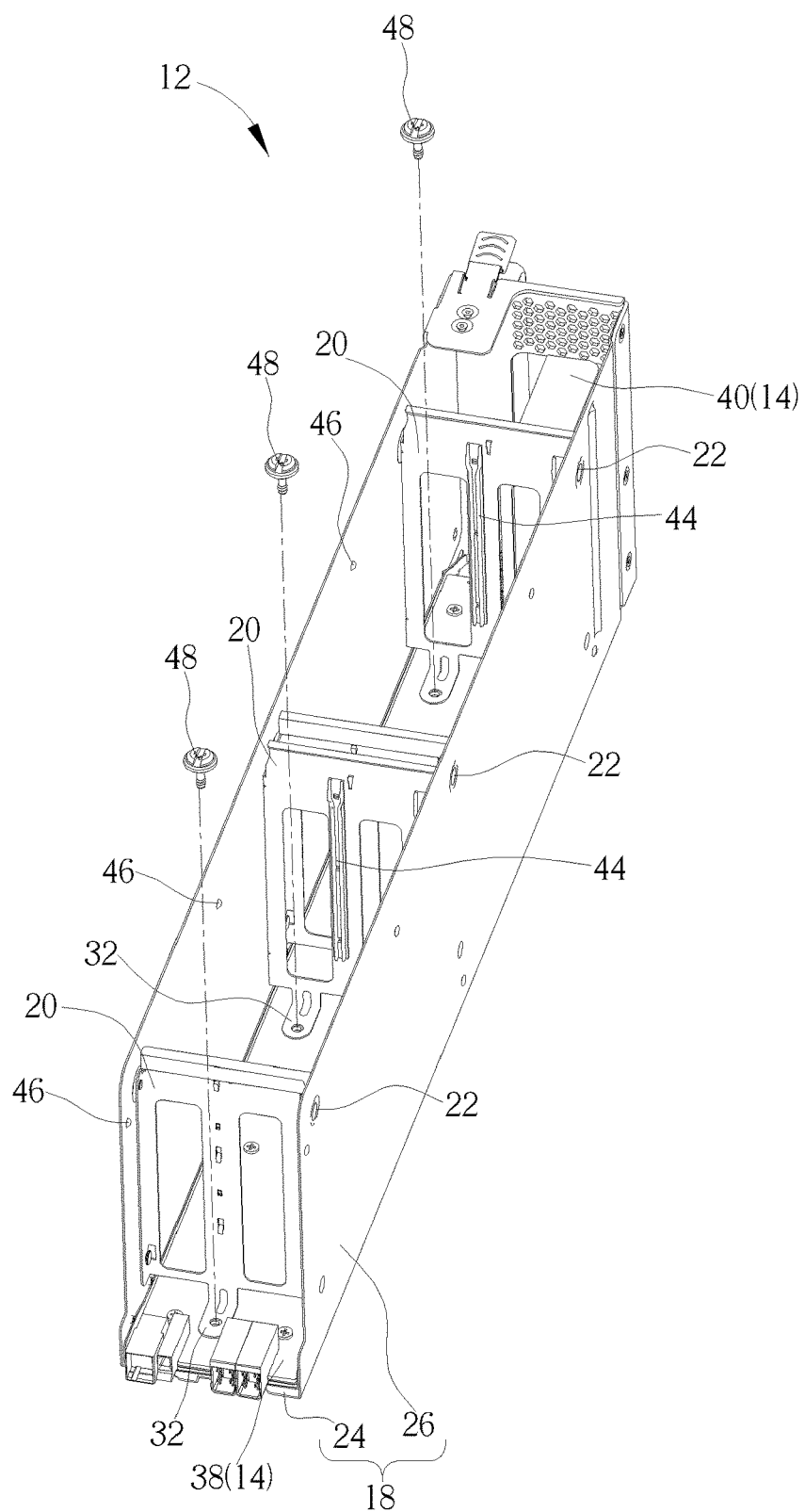
FIG. 7 to FIG. 9 respectively are diagrams of the housing module without the circuit board 14 in different operation modes according to the embodiment of the present application.
Figure 8:
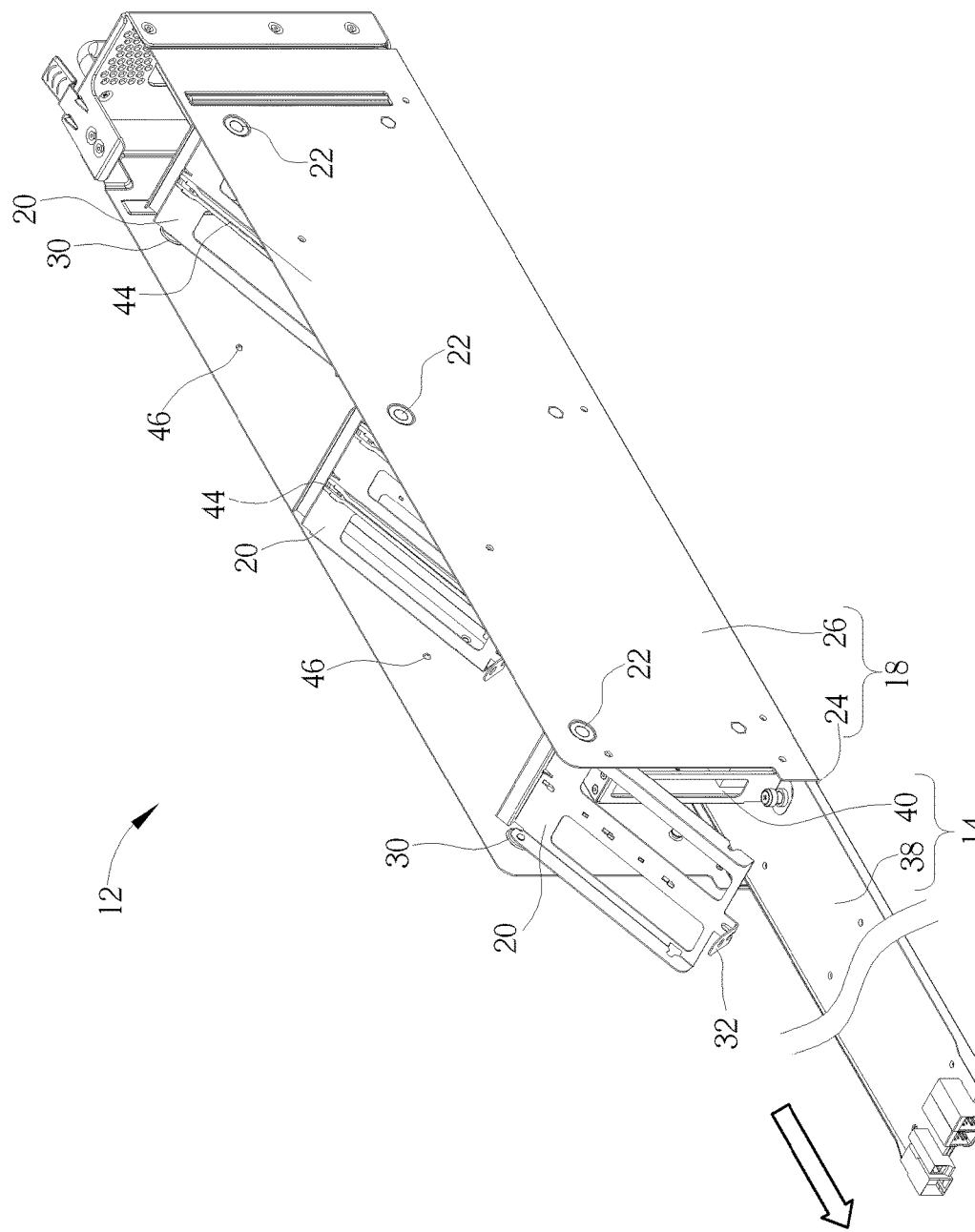
Figure 9:
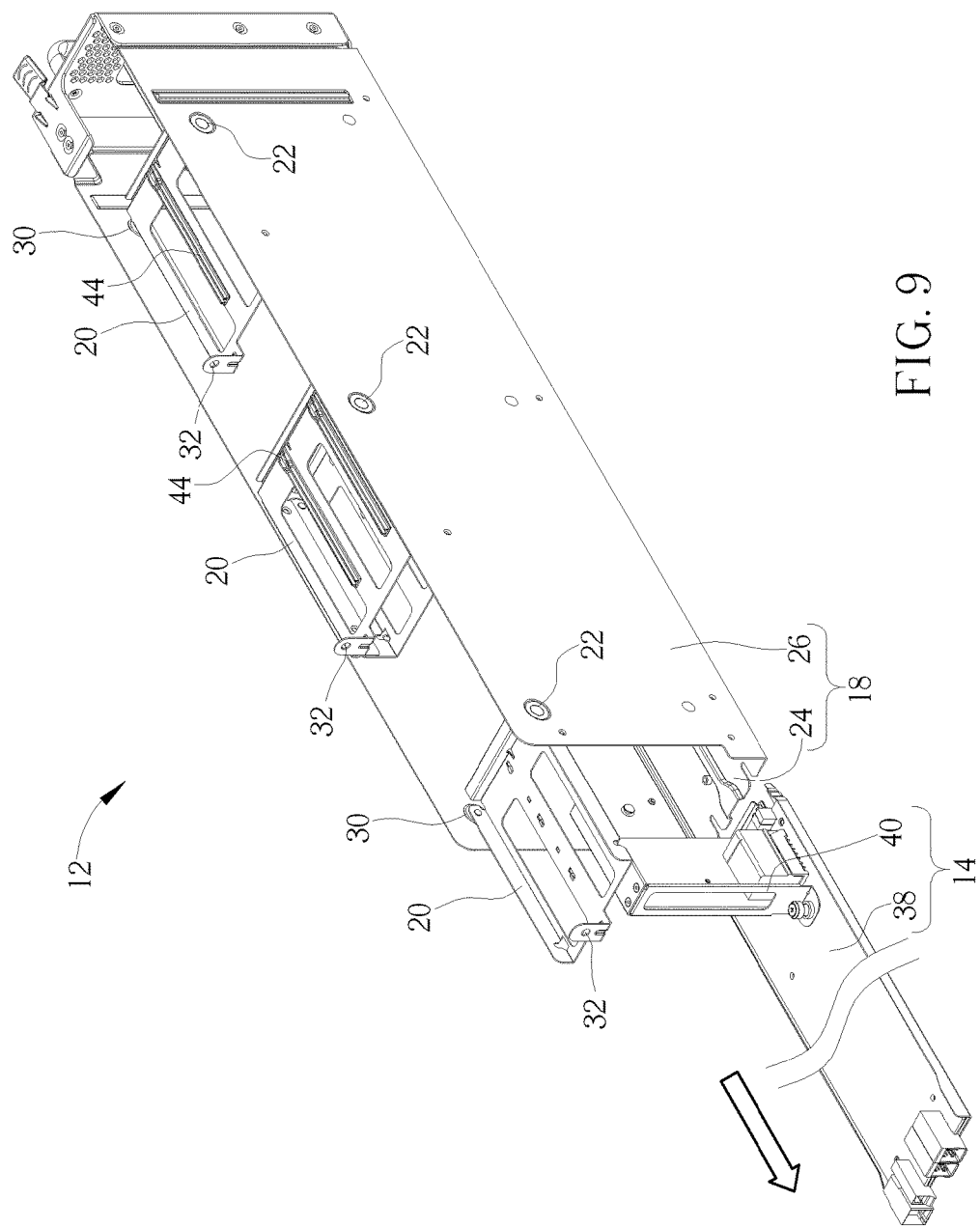

Please refer to FIG. 3, FIG. 7 to FIG. 9. FIG. 7 to FIG. 9 respectively are diagrams of the housing module 12 without the circuit board 14 in different operation modes according to the embodiment of the present application. As shown in FIG. 3, the locking portion 32 of the spacer 20 is locked on the circuit board 14 via a fixing component 48, which represents the fixing component 48 can pass through the locking portion 32 and the circuit board 14 to constrain rotation of the spacer 20. As shown in FIG. 7, the fixing component 48 is removed from the locking portion 32 for disassembly of the circuit board 14, the spacer 20 is connected to the housing 18 merely by the pivoting portion 30, and then the circuit board 14 can be manually pulled out of the housing 18. Meanwhile, the external board 40 of the circuit board 14 presses and pushes the spacer 20, the spacer 20 is rotated relative to the lateral board 26 via the pivoting portion 30. The optimal position of the external board 40 is lower than position of the pivoting portion 30. The spacer 20 is gradually lifted up in accordance with an outward movement of the circuit board 14, such like from a situation shown in FIG. 8 toward a situation shown in FIG. 9. The spacer 20 is rotated to the predetermined maximal angle to engage with the constraining portion 46, and the maximal angle may be equal to, but not limited to, ninety degrees.

In the present application, the spacer 20 is not detached from the housing 18 during assembly and disassembly process of the circuit board 14. The spacer 20 of the housing module 12 is rotatably disposed on the housing 18 via the pivoting component 22, so that a behavior of pulling the circuit board 14 out of the housing 18 can simultaneously drive rotation of the spacer 20, so as to provide sufficient space within the housing module 12 for removal of the circuit board 14. The spacer 20 can be blocked by the constraining portion 46 while being rotated to the maximal angle; in the other possible embodiment, the spacer 20 may be not engaged with the constraining portion 46, and is falling to an original position since the spacer 20 does not contact the external board 40.

Figure 10:
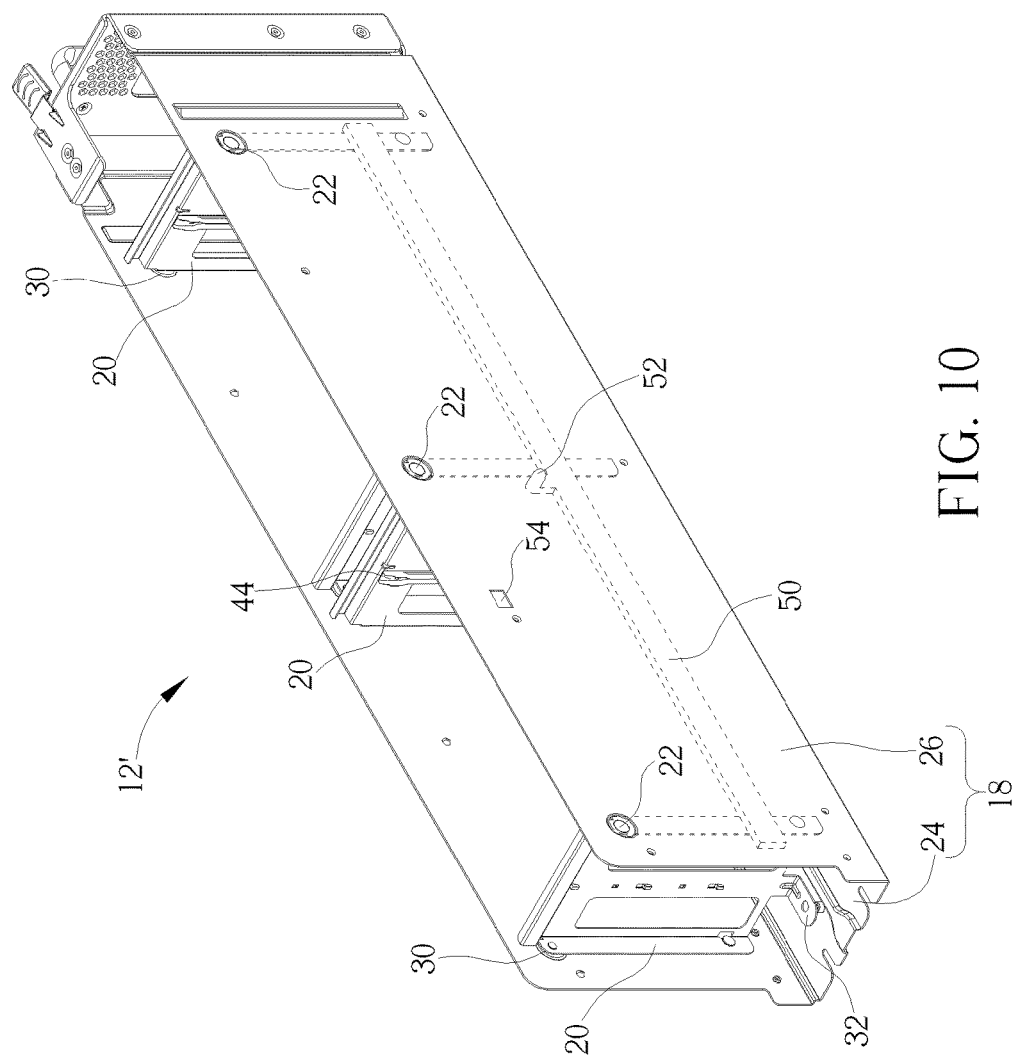
FIG. 10 and FIG. 11 respectively are diagrams of the housing module in different operation modes according to another embodiment of the present application.
Figure 11:
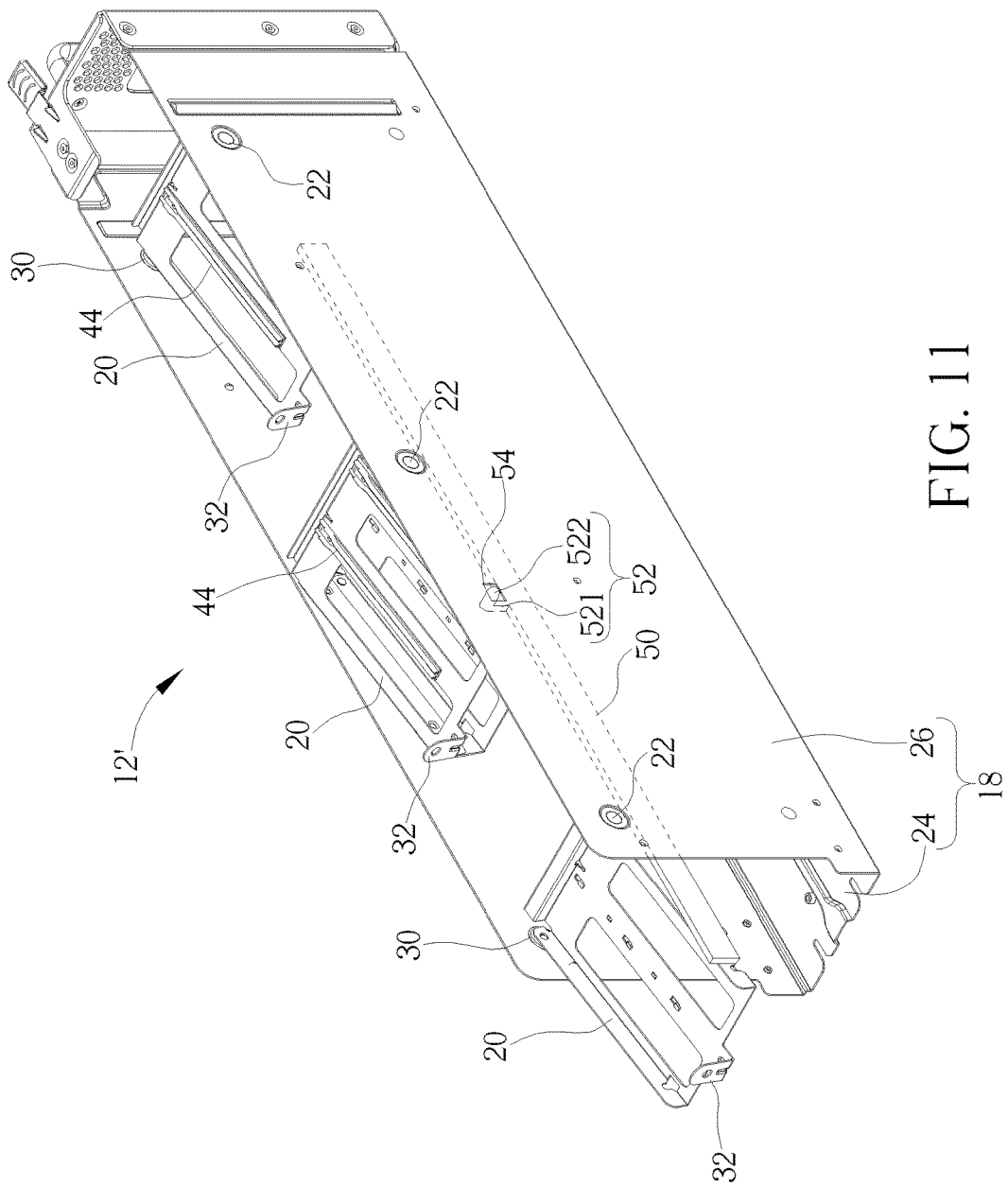

Please refer to FIG. 10 and FIG. 11. FIG. 10 and FIG. 11 respectively are diagrams of the housing module 12' in different operation modes according to another embodiment of the present application. The housing module 12' further can include a linking component 50, and several sections of the linking component 50 are respectively connected to the plurality of spacers 20, such as connecting to the lateral side 281 of the main body 28. In the disassembly of the circuit board 14, one of the spacers 20 inside the housing 18 is pushed and upwardly rotated by the external board 40, and other spacers 20 can be simultaneously rotated via the linking component 50. Besides, the linking component 50 may have a buckling portion 52. The buckling portion 52 can be a dual-bending structure, a first section 521 of the dual-bending structure is connected to a body of the linking component 50 in a resiliently deformable manner, and a second section 522 of the dual-bending structure is bent from the first section 521 and slidably contacts against the lateral board 26. While the spacer 20 is rotated relative to the housing 18 to a specific angle, the buckling portion 52 aligns with a connective portion 54 of the lateral board 26, a resilient recovering force of the first section 521 moves the second section 522 relative to the connective portion 54, so that the buckling portion 52 can accurately buckle with the connective portion 54 to prevent the spacer 20 from falling to the original position. The specific angle can be preferably ranged between 70 degrees and 90 degrees, which depend on structural dimensions of the external board 40. The connective portion 54 can be an upper edge of the lateral board 26 or an engaging slot formed on the lateral board 26, and configuration of the connective portion 54 is set according to design demand.

In conclusion, the housing module 12 of the present application includes the spacer 20 rotatably disposed on the housing 18. For assembling the circuit board 14 into the housing module 12, the spacer 20 is upwardly rotated to provide sufficient space, and the spacer 20 can be positioned at the specific angle manually or by engagement of the constraining portion 46 and/or the buckling portion 52. Then, the circuit board 14 slides into the housing 18 through the substrate 24, and the locking portion 32 of the spacer 20 is locked on the circuit board 14 via the fixing component 48. For disassembling the circuit board 14 from the housing module 12, the fixing component 48 is removed to unlock the locking portion 32 and the circuit board 14, the circuit board 14 is pulled outwardly to contact the external board 40 against the spacer 20, and the spacer 20 can be rotated upwardly via the pivoting portion 30 in accordance with the removal of the circuit board 14, so the circuit board 14 can be freely taken out of the housing module 12 without obstruction.

Comparing to the prior art, the housing module and the related electronic device of the present application have the circuit board quick-assembling function, the circuit board with the erected external board can be freely assembled with and disassembled from the housing without detachment of the spacer, so as to increase assembly period and decrease packing and transportation cost for preferred product competition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A housing module having a circuit board quick-assembling function and capable of being applied to a circuit board with a specific height, the housing module comprising:
   a housing, comprising a substrate and a plurality of lateral boards, the plurality of lateral boards being respectively connected to edges of the substrate to form an accommodating space, the housing module further comprising a plurality of spacers each having:
   a main body;

two pivoting portions respectively disposed on corresponding lateral sides of the main body;
a locking portion stretching from a bottom side of the main body;
a track structure disposed on the main body for guiding a detachable module; and
two pivoting components respectively passing through the plurality of lateral boards and connected to the corresponding pivoting portions, the main body being rotated within the accommodating space via the two pivoting portions while the circuit board slides relative to the substrate to push the plurality of spacers, so as to lift the bottom side away from the substrate.

2. The housing module of claim 1, wherein the housing further comprises two protruding portions respectively disposed on the plurality of lateral boards corresponding to the two pivoting portions, the two pivoting components respectively pass through the corresponding pivoting portions and the corresponding protruding portions to space the corresponding lateral sides of the main body from the plurality of lateral boards.

3. The housing module of claim 2, wherein the housing further comprises a constraining portion disposed on one of the plurality of lateral boards and adjacent to one of the two protruding portions.

4. The housing module of claim 1, wherein the housing further comprises a cover detachably disposed on accommodating space of the plurality of lateral boards opposite to the substrate and adapted to cover the accommodating space, a detachable module is assembled inside the accommodating space through the cover.

5. The housing module of claim 1, wherein a buckling portion of the linking component is a dual-bending structure, a first section of the dual-bending structure is connected to a body of the linking component in a resiliently deformable manner, and a second section of the dual-bending structure slidably contacts against one of a plurality of lateral boards, so as to buckle the buckling portion with a connective portion on the lateral board while the buckling portion and the connective portion are aligned.

6. The housing module of claim 5, wherein the connective portion is an edge of the lateral board, or an engaging slot formed on the lateral board.

7. The housing module of claim 5, wherein the buckling portion is buckled with the connective portion while the spacer is rotated relative to the housing to a specific angle ranged between 70 degrees and 90 degrees.

8. The housing module of claim 1, further comprising:
a fixing component passing through the locking portion and the circuit board to constrain rotation of the spacer.

9. An electronic device having a circuit board quick-assembling function, comprising:
a housing module, comprising:
a housing, comprising a substrate and a plurality of lateral boards, the plurality of lateral boards being respectively connected to edges of the substrate to form an accommodating space, the housing module further comprising a plurality of spacers each having:
a main body;
two pivoting portions respectively disposed on corresponding lateral sides of the main body;
a locking portion stretching from a bottom side of the main body;
a track structure disposed on the main body for guiding a detachable module; and
two pivoting components respectively passing through the plurality of lateral boards and connected to the corresponding pivoting portions; and
a circuit board slidably disposed on the substrate, the plurality of spacers being pushed by the circuit board sliding relative to the substrate, so as to rotate the main body within the accommodating space via the two pivoting portions and to lift the bottom side away from the substrate.

10. The electronic device of claim 9, wherein the circuit board comprises a main board and an external board, the external board is disposed on the main board, a distance between the substrate and the bottom side of the main body is greater than a thickness of the main board and smaller than a structural height of the external board.

11. The electronic device of claim 9, wherein the detachable module is moved into the accommodating space of the housing via the track structure, and is further adapted to contact against the spacer and connect with the circuit board.

12. The electronic device of claim 9, wherein the housing further comprises two protruding portions respectively disposed on the plurality of lateral boards corresponding to the two pivoting portions, the two pivoting components respectively pass through the corresponding pivoting portions and the corresponding protruding portions to space the corresponding lateral sides of the main body from the plurality of lateral boards.

13. The electronic device of claim 12, wherein the housing further comprises a constraining portion disposed on one of the plurality of lateral boards and adjacent to one of the two protruding portions.

14. The electronic device of claim 9, wherein the housing further comprises a cover detachably disposed on accommodating space of the plurality of lateral boards opposite to the substrate and adapted to cover the accommodating space, a detachable module is assembled inside the accommodating space through the cover.

* * * * *